United States Patent
Lue et al.

(10) Patent No.: US 7,907,450 B2
(45) Date of Patent: Mar. 15, 2011

(54) METHODS AND APPARATUS FOR IMPLEMENTING BIT-BY-BIT ERASE OF A FLASH MEMORY DEVICE

(75) Inventors: Hang-Ting Lue, Hsinchu (TW); Erh Kun Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/549,502

(22) Filed: Oct. 13, 2006

(65) Prior Publication Data
US 2007/0258291 A1 Nov. 8, 2007

Related U.S. Application Data

(60) Provisional application No. 60/746,722, filed on May 8, 2006.

(51) Int. Cl.
*G11C 16/04* (2006.01)

(52) U.S. Cl. .......... 365/185.18; 365/185.17; 365/185.28; 365/185.29; 365/185.33; 365/185.11; 365/185.05

(58) Field of Classification Search .......... 365/185.18, 365/185.17, 185.28, 185.29, 185.33, 176, 365/161, 185.11, 185.05; 257/296
See application file for complete search history.

(56) References Cited

U.S. PATENT DOCUMENTS

| | | | |
|---|---|---|---|
| 4,630,086 A | 12/1986 | Sato et al. | |
| 4,959,812 A | 9/1990 | Momodomi et al. | |
| 5,100,819 A * | 3/1992 | Gill et al. | 438/263 |
| 5,105,384 A * | 4/1992 | Noguchi et al. | 365/185.23 |
| 5,197,027 A * | 3/1993 | Challa | 365/185.16 |
| 5,270,969 A | 12/1993 | Iwahashi et al. | |
| 5,278,439 A | 1/1994 | Ma et al. | |
| 5,286,994 A | 2/1994 | Ozawa et al. | |
| 5,319,229 A | 6/1994 | Shimoji et al. | |
| 5,355,464 A | 10/1994 | Fandrich et al. | |
| 5,386,132 A * | 1/1995 | Wong | 257/316 |
| 5,408,115 A | 4/1995 | Chang | |
| 5,412,603 A | 5/1995 | Schreck et al. | |
| 5,414,658 A * | 5/1995 | Challa | 365/185.06 |
| 5,424,569 A | 6/1995 | Prall | |

(Continued)

FOREIGN PATENT DOCUMENTS

CN 1564263 1/2005

(Continued)

OTHER PUBLICATIONS

Hang-Ting Lue, et al. "BE-SONOS: A Bandgap Engineered SONOS with Excellent Performance and Reliability", 2005 IEEE, IEDM 2005, session 22-3, pp. 881-884.

(Continued)

*Primary Examiner* — Huan Hoang
*Assistant Examiner* — Fernando N Hidalgo
(74) *Attorney, Agent, or Firm* — Haynes Beffel & Wolfeld LLP

(57) ABSTRACT

A NAND memory device is constructed using Silicon On Insulator (SOI) techniques. In particular, Thin Film Transistor (TFT) techniques can be used to fabricate the NAND Flash memory device. In both SOI and TFT structures, the body, or well, is isolated. This can be used to enable a bit-by-bit programming and erasing of individual cells and allows tight control of the threshold voltage, which can enable MLC operation.

21 Claims, 10 Drawing Sheets

U.S. PATENT DOCUMENTS

| | | | |
|---|---|---|---|
| 5,448,517 A | 9/1995 | Iwahashi et al. | |
| 5,473,563 A * | 12/1995 | Suh et al. | 365/185.13 |
| 5,483,486 A | 1/1996 | Javanifard et al. | |
| 5,485,422 A | 1/1996 | Bauer et al. | |
| 5,509,134 A | 4/1996 | Fandrich et al. | |
| 5,515,324 A | 5/1996 | Tanaka et al. | |
| 5,516,713 A * | 5/1996 | Hsue et al. | 438/261 |
| 5,566,120 A | 10/1996 | D'Souza | |
| 5,581,504 A * | 12/1996 | Chang | 365/185.17 |
| 5,589,699 A * | 12/1996 | Araki | 257/316 |
| 5,602,775 A | 2/1997 | Vo | |
| 5,622,879 A * | 4/1997 | Devin | 438/266 |
| 5,644,533 A | 7/1997 | Lancaster et al. | |
| 5,668,029 A | 9/1997 | Huang et al. | |
| 5,694,356 A | 12/1997 | Wong et al. | |
| 5,745,410 A | 4/1998 | Yiu et al. | |
| 5,745,412 A * | 4/1998 | Choi | 365/185.1 |
| 5,753,950 A | 5/1998 | Kojima et al. | |
| 5,768,192 A | 6/1998 | Eitan et al. | |
| RE35,838 E | 7/1998 | Momodomi et al. | |
| 5,835,396 A | 11/1998 | Zhang | |
| 5,877,054 A | 3/1999 | Yamauchi et al. | |
| 5,883,409 A | 3/1999 | Guterman et al. | |
| 5,895,949 A | 4/1999 | Endoh et al. | |
| 5,952,692 A | 9/1999 | Nakazato et al. | |
| 5,966,603 A | 10/1999 | Eitan et al. | |
| 6,011,725 A | 1/2000 | Eitan et al. | |
| 6,026,026 A | 2/2000 | Chan et al. | |
| 6,034,896 A | 3/2000 | Ranaweera et al. | |
| 6,074,917 A | 6/2000 | Chang et al. | |
| 6,096,603 A | 8/2000 | Chang et al. | |
| 6,151,248 A | 11/2000 | Harari et al. | |
| 6,166,418 A * | 12/2000 | Tihanyi | 257/409 |
| 6,169,693 B1 | 1/2001 | Chan et al. | |
| 6,172,907 B1 | 1/2001 | Jenne | |
| 6,194,272 B1 | 2/2001 | Sung et al. | |
| 6,215,148 B1 | 4/2001 | Eitan et al. | |
| 6,218,700 B1 | 4/2001 | Papadas et al. | |
| 6,219,276 B1 | 4/2001 | Parker | |
| 6,297,096 B1 | 10/2001 | Boaz et al. | |
| 6,320,786 B1 | 11/2001 | Chang et al. | |
| 6,322,903 B1 | 11/2001 | Siniaguine et al. | |
| 6,356,478 B1 | 3/2002 | McCollum | |
| 6,363,013 B1 | 3/2002 | Lu et al. | |
| 6,396,741 B1 | 5/2002 | Bloom et al. | |
| 6,436,768 B1 | 8/2002 | Yang et al. | |
| 6,458,642 B1 | 10/2002 | Yeh et al. | |
| 6,487,114 B2 | 11/2002 | Jong et al. | |
| 6,512,696 B1 | 1/2003 | Fan et al. | |
| 6,522,585 B2 | 2/2003 | Pasternak | |
| 6,538,923 B1 | 3/2003 | Parker | |
| 6,552,386 B1 | 4/2003 | Wu et al. | |
| 6,566,699 B2 | 5/2003 | Eitan et al. | |
| 6,587,903 B2 | 7/2003 | Roohparvar | |
| 6,614,070 B1 | 9/2003 | Hirose et al. | |
| 6,614,694 B1 | 9/2003 | Yeh et al. | |
| 6,617,639 B1 | 9/2003 | Wang et al. | |
| 6,643,181 B2 | 11/2003 | Sofer et al. | |
| 6,643,185 B1 | 11/2003 | Wang et al. | |
| 6,645,813 B1 | 11/2003 | Hsieh et al. | |
| 6,646,924 B1 | 11/2003 | Tsai et al. | |
| 6,653,733 B1 | 11/2003 | Gonzalez et al. | |
| 6,657,252 B2 | 12/2003 | Fried et al. | |
| 6,657,894 B2 | 12/2003 | Yeh et al. | |
| 6,670,240 B2 | 12/2003 | Ogura et al. | |
| 6,670,671 B2 | 12/2003 | Sasago et al. | |
| 6,674,138 B1 | 1/2004 | Halliyal et al. | |
| 6,677,200 B2 | 1/2004 | Lee et al. | |
| 6,690,601 B2 | 2/2004 | Yeh et al. | |
| 6,709,928 B1 | 3/2004 | Jenne et al. | |
| 6,714,457 B1 | 3/2004 | Hsu et al. | |
| 6,720,630 B2 | 4/2004 | Mandelman et al. | |
| 6,744,105 B1 | 6/2004 | Chen et al. | |
| 6,784,480 B2 | 8/2004 | Bhattacharyya | |
| 6,795,357 B1 | 9/2004 | Liu et al. | |
| 6,798,012 B1 | 9/2004 | Ma et al. | |
| 6,815,805 B2 | 11/2004 | Weimer | |
| 6,818,558 B1 | 11/2004 | Rathor et al. | |
| 6,829,175 B2 | 12/2004 | Tsai et al. | |
| 6,841,813 B2 | 1/2005 | Walker et al. | |
| 6,856,551 B2 | 2/2005 | Mokhlesi et al. | |
| 6,858,899 B2 | 2/2005 | Mahajani et al. | |
| 6,858,906 B2 | 2/2005 | Lee et al. | |
| 6,885,044 B2 | 4/2005 | Ding | |
| 6,888,750 B2 | 5/2005 | Walker et al. | |
| 6,897,533 B1 | 5/2005 | Yang et al. | |
| 6,912,163 B2 | 6/2005 | Zheng et al. | |
| 6,925,007 B2 | 8/2005 | Harari et al. | |
| 6,933,555 B2 | 8/2005 | Hsieh et al. | |
| 6,937,511 B2 | 8/2005 | Hsu et al. | |
| 6,942,320 B2 | 9/2005 | Chung et al. | |
| 6,970,383 B1 | 11/2005 | Han et al. | |
| 6,977,201 B2 | 12/2005 | Jung et al. | |
| 6,995,424 B2 | 2/2006 | Lee et al. | |
| 6,996,011 B2 | 2/2006 | Yeh et al. | |
| 7,005,366 B2 | 2/2006 | Chau et al. | |
| 7,012,297 B2 | 3/2006 | Bhattacharyya | |
| 7,018,895 B2 | 3/2006 | Ding | |
| 7,026,682 B2 | 4/2006 | Chung et al. | |
| 7,057,234 B2 | 6/2006 | Tiwari | |
| 7,071,061 B1 | 7/2006 | Pittikoun et al. | |
| 7,075,828 B2 | 7/2006 | Lue et al. | |
| 7,106,625 B2 | 9/2006 | Yeh et al. | |
| 7,115,469 B1 | 10/2006 | Halliyal et al. | |
| 7,115,942 B2 | 10/2006 | Wang | |
| 7,120,059 B2 | 10/2006 | Yeh et al. | |
| 7,129,538 B2 | 10/2006 | Lee et al. | |
| 7,133,313 B2 | 11/2006 | Shih et al. | |
| 7,135,734 B2 | 11/2006 | Eldridge et al. | |
| 7,151,692 B2 | 12/2006 | Wu et al. | |
| 7,154,143 B2 | 12/2006 | Jung et al. | |
| 7,154,779 B2 | 12/2006 | Mokhlesi et al. | |
| 7,157,769 B2 | 1/2007 | Forbes | |
| 7,158,420 B2 | 1/2007 | Lung | |
| 7,164,603 B2 | 1/2007 | Shih et al. | |
| 7,166,513 B2 | 1/2007 | Hsu et al. | |
| 7,187,590 B2 | 3/2007 | Zous et al. | |
| 7,209,386 B2 | 4/2007 | Yeh et al. | |
| 7,209,390 B2 | 4/2007 | Lue et al. | |
| 7,250,646 B2 | 7/2007 | Walker et al. | |
| 7,279,740 B2 | 10/2007 | Bhattacharyya et al. | |
| 7,339,825 B2 * | 3/2008 | Iioka et al. | 365/185.13 |
| 7,528,447 B2 * | 5/2009 | Enda et al. | 257/347 |
| 7,550,334 B2 * | 6/2009 | Kato et al. | 438/164 |
| 2001/0012663 A1 | 8/2001 | Magri' et al. | |
| 2001/0055838 A1 | 12/2001 | Walker et al. | |
| 2002/0167844 A1 | 11/2002 | Han et al. | |
| 2002/0179958 A1 | 12/2002 | Kim | |
| 2003/0023603 A1 | 1/2003 | Ellison et al. | |
| 2003/0025147 A1 | 2/2003 | Nomoto et al. | |
| 2003/0030100 A1 | 2/2003 | Lee et al. | |
| 2003/0032242 A1 | 2/2003 | Lee et al. | |
| 2003/0036250 A1 | 2/2003 | Lin et al. | |
| 2003/0042534 A1 | 3/2003 | Bhattacharyya | |
| 2003/0047755 A1 | 3/2003 | Lee et al. | |
| 2003/0067032 A1 | 4/2003 | Caprara et al. | |
| 2003/0146465 A1 | 8/2003 | Wu | |
| 2003/0185055 A1 | 10/2003 | Yeh et al. | |
| 2003/0224564 A1 | 12/2003 | Kang et al. | |
| 2004/0013000 A1 * | 1/2004 | Torii | 365/185.22 |
| 2004/0079983 A1 | 4/2004 | Chae et al. | |
| 2004/0084714 A1 | 5/2004 | Ishii et al. | |
| 2004/0125629 A1 | 7/2004 | Scheuerlein et al. | |
| 2004/0145024 A1 | 7/2004 | Chen et al. | |
| 2004/0183126 A1 | 9/2004 | Bae et al. | |
| 2004/0240269 A1 * | 12/2004 | Cernea | 365/185.12 |
| 2004/0256679 A1 | 12/2004 | Hu | |
| 2005/0001258 A1 | 1/2005 | Forbes | |
| 2005/0006696 A1 * | 1/2005 | Noguchi et al. | 257/316 |
| 2005/0023603 A1 | 2/2005 | Eldridge et al. | |
| 2005/0062091 A1 | 3/2005 | Ding | |
| 2005/0074937 A1 | 4/2005 | Jung | |
| 2005/0093054 A1 | 5/2005 | Jung | |
| 2005/0218522 A1 | 10/2005 | Nomoto et al. | |
| 2005/0219906 A1 | 10/2005 | Wu | |
| 2005/0237801 A1 | 10/2005 | Shih | |
| 2005/0237809 A1 | 10/2005 | Shih et al. | |

| | | | |
|---|---|---|---|
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0255652 | A1 | 11/2005 | Nomoto et al. |
| 2005/0270849 | A1 | 12/2005 | Lue |
| 2005/0281085 | A1 | 12/2005 | Wu |
| 2006/0007732 | A1 | 1/2006 | Yeh |
| 2006/0034140 | A1* | 2/2006 | Ogawa et al. ............ 365/230.03 |
| 2006/0044872 | A1 | 3/2006 | Nazarian |
| 2006/0088983 | A1 | 4/2006 | Fujisawa et al. |
| 2006/0146614 | A1* | 7/2006 | Lue et al. ................ 365/185.28 |
| 2006/0158930 | A1* | 7/2006 | Thomas ........................ 365/177 |
| 2006/0197145 | A1 | 9/2006 | Pittikoun et al. |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202256 | A1 | 9/2006 | Harari |
| 2006/0202261 | A1* | 9/2006 | Lue et al. ...................... 257/324 |
| 2006/0234446 | A1 | 10/2006 | Wei et al. |
| 2006/0258090 | A1 | 11/2006 | Bhattacharyya et al. |
| 2006/0261401 | A1 | 11/2006 | Bhattacharyya |
| 2006/0275986 | A1 | 12/2006 | Kobayashi et al. |
| 2006/0281260 | A1 | 12/2006 | Lue |
| 2007/0076477 | A1 | 4/2007 | Hwang et al. |

FOREIGN PATENT DOCUMENTS

| | | |
|---|---|---|
| EP | 0016246 | 10/1980 |
| EP | 1411555 | 4/2004 |
| JP | 09162313 | 6/1997 |
| JP | 11040682 | 2/1999 |
| JP | 11233653 | 8/1999 |
| JP | 2004363329 | 12/2004 |
| WO | WO-9428551 | 12/1994 |

OTHER PUBLICATIONS

Yoocheol Shin, et al. "A Novel NAND-type MONOS Memory Using 63nm Process Technology for Multi-Gigabit Flash EEPROMs", 2005 IEEE, IEDM 2005, session 13-6.

Erh-Kun Lai, et al. "A Highly Stackable Thin-Film Transistor (TFT) NAND-Type Flash Memory", VLSI Technology, 2006, session 6-4.

White et al., "On the Go with SONOS" IEEE Circuits and Devices, Jul. 2000, 22-31.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3. 1-36.3.4.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Sung, et al., "Multi-layer SONOS with Direct Tunnel Oxide for High Speed and Long Retention Time," IEEE 2002 Nanoelectronics Workshop, Jun. 2002, 83-84.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Yeh, C.C., et al., "PHINES: A Novel Low Power Program/Erase, Small Pitch, 2-Bit per Cell Flash Memory," IEDM Tech. Dig. 2002, 931-934.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22. 6..4 (2003).

Bude, J.D., et al. "Secondary Electron Flash—a High Performance, Low Power Flash Technology for 0.35 um and Below," IEEE IEDM Technical Digest, International, Dec. 7-10, 1997, 279-282.

Chung, Steve S., et al., "A Novel Leakage Current Separation Technique in a Direct Tunneling Regime Gate Oxide SONOS Memory Cell," IEEE IEDM Technical Digest, Dec. 8-10, 2003, 26.6.1-26.6.4.

Chung Steve S., "Low Voltage/Power and High Speed Flash Memory Technology for High Performance and Reliability," The 3rd WIMNACT—Singapore, Oct. 15, 2003, 1-48.

De Blauwe, Jan, "Nanocrystal Nonvolatile Memory Devices," IEEE Transactions on Nanotechnology, vol. 1, No. 1, Mar. 2002, 72-77.

Eitan, Boaz, "Can NROM, a 2-bit, Trapping Storage NVM Cell, Give a Real Challenge to Floating Gate Cells?" SSDM, Tokyo, Japan (1999), 3 pages.

Hirose, M., "Challenges for Future Semiconductor Development," Microprocesses and Nanotechnology Conference, Digest of Papers, Nov. 6-8, 2002, 26 pages.

Huff, H.R. et al., assemblers, "Questions at the International Workshop on Gate Insulators," Ad Hoc Meeting on High-k Dielectrics at the Semiconductor Interface Specialists Conference, Nov. 30, 2001, 3 pages.

Janai, Meir, "Data Retention, Endurance and Acceleration Factors of NROM Devices," IEEE 41st Annual Int'l Reliability Physics Symp., Dallas, Texas, 2003, 502-505.

Lee, Changhyun, et al, "A Novel Structure of SiO2/SiN/High k Dielectrics, Al2O3 for SONOS Type Flash Memory," Extended Abstracts of the 2002 Int'l Conf. on Solid State Devices and Materials, Sep. 17-19, 2002, Nagoya, 162-163.

Liu, Zhizheng, et al., "A New Programming Technique for Flash Memory Devices," International Symposium on VLSI Technology, Systems and Applications, Jun. 8-10, 1999, 195-198.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Tsai, W.J., et al., " Data Retention Behavior of a SONOS Type Two-Bit Storage Flash Memory Cell," Electron Devices Meeting, 2001. IEDM Technical Digest International, Dec. 2-5, 2001 pp. 32.6. 1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International, Dec. 8-10, 2003, pp. 7.4.1-7.4.4.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International, Dec. 8-10, 2003, pp. 7.5.1-7.5.4.

Xuan et al., "FinFET SONOS Flash Memory for Embedded Applications," IEEE 2003, pp. 26.4.1-26.4.4.

Hsu et al., "Split-Gate NAND Flash Memory at 120nm Technology Node Featuring Fast Programming and Erase," 2004 Symposium on VLSI Technology, Digest of Technical Papers, pp. 78-79.

U.S. Appl. No. 11/394,649, filed Mar. 31, 2006, "Notice of Allowance and Fee(s) Due" mailed Feb. 15, 2008, 12 pages.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Likharev, "Layered Tunnel Barriers for Nonvolatile Memory Devices," Appl. Phys. Lett. 73(15) Oct. 1998 2137-2139.

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Office Action mailed Nov. 23, 2007 in U.S. Appl. No. 11/197,668.

Office Action mailed Oct. 19, 2007 in U.S. Appl. No. 11/324,495.

Sasago, Y. et al., "90-nm-node multi-level AG-AND type flash memory with cell size of true 2F/sup 2//bit and programming throughput of 10 Mb/s," IEDM, 2003, pp. 823-826.

Fujiwara, I., et al., "0.13 μm MONOS single transistor memory cell with deparated source lines," IEDM 1998, 995-998.

Chang, Kuo-Tung, et al., "A New SONOS Memory Using Source-Side Injection for Programming," IEEE Electron Device Letters, vol. 19, No. 7, Jul. 1998, 253-255.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Naruke, K., et al., "Nonvolatile Semiconductor Memories: Technologies, design and application," C. Hu. Ed., New York, IEEE Press, 1991, Ch. 5, pp. 183-186.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lee, Jae-Duk, et al., "Effects of Floating-Gate Interference on NAND Flash Memory Cell Operation," IEEE Electron Device Letters, vol. 23, No. 5, May 2002, 264-266.

Shin, Yoocheol, et al., "High Reliable SONOS-type NAND Flash Memory Cell with Al2O3 for Top Oxide," Non-Volatile Semiconductor Memory Workshop, 2003, 2 pages.

Takata, M, et al. "New Non-Volatile Memory with Extremely High Density Metal Naon-Dots," IEEE IEDM 03-553, 22.5.1-22.5.4.

Baik, Seung, et al., "High Speed adn Nonvolatile Si Nanocrystal Memory for Scaled Flash Technology Using Highly Field-Sensitive Tunnel Barrier," IEEE IEDM 03-545, 22.3.1-22.3.4.

Lee, Chang, et al., "A Novel SONOS Structure of SiO2/SiN/Al2O3 with TaN Metal Gate for Multi-Giga Bit Flash Memeries," IEEE 2003 4 pages.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4 (2003).

* cited by examiner

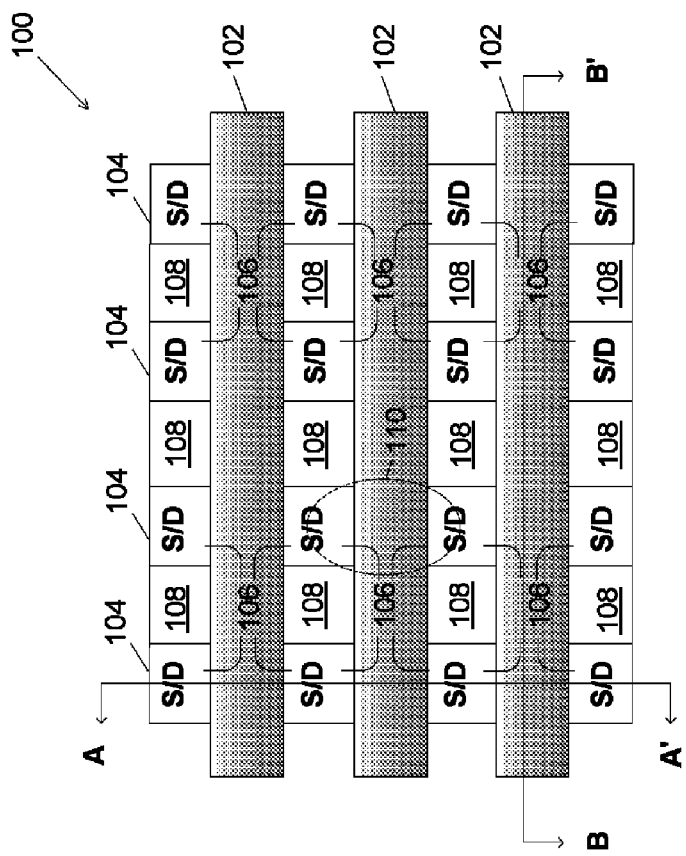
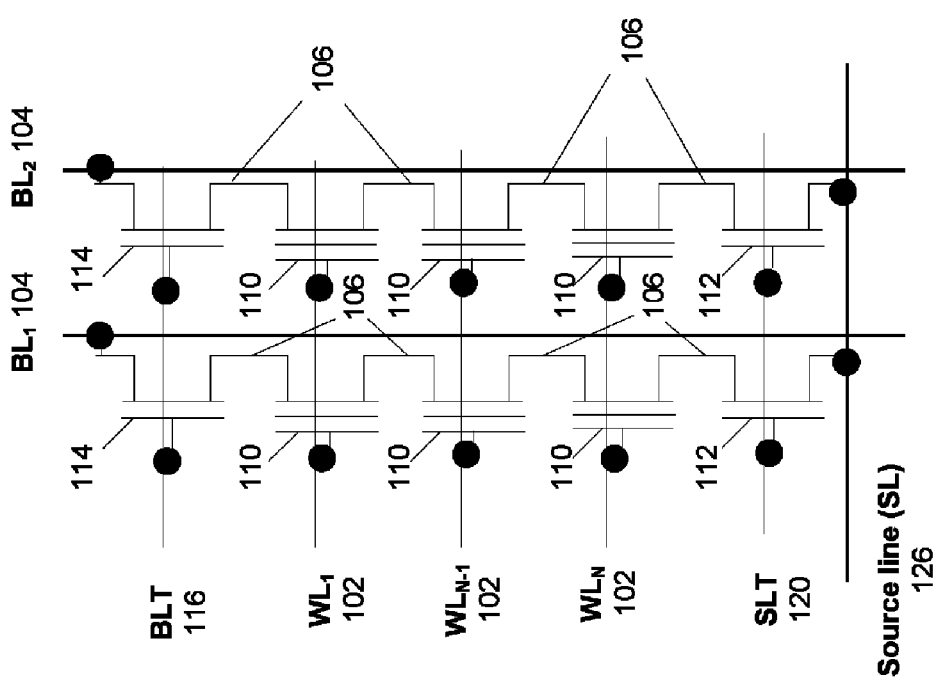
FIG. 1
FIG. 2

METHODS AND APPARATUS FOR IMPLEMENTING BIT-BY-BIT ERASE OF A FLASH MEMORY DEVICE

RELATED APPLICATIONS INFORMATION

This application claims priority under 35 U.S.C. 119(e) to U.S. Provisional Application Ser. No. 60/746,722, entitled "A Bit-by-Bit Program/Erase Method for NAND Flash Memory Device Using SOI or TFT Technology," filed May 8, 2006, and which is incorporated herein by reference as if set forth in full.

BACKGROUND

1. Field

The embodiments described herein relate generally to Flash memory devices, and more particularly to methods for operating a Flash memory device that allow the device to be programmed and erased on a bit-by-bit basis and that allow for tight control of the programmed threshold voltage enabling multi-level cell applications.

2. Background

Conventional Flash memory devices are either NOR or NAND-type devices. In a conventional NOR device, each cell comprises a well known single transistor architecture. The single transistor comprising each cell is similar to a standard MOSFET, except that it comprises a two-gate structure. One gate is referred to as the control gate, which operates similar to the gate in a conventional MOSFET transistor. The second gate is referred to as the floating gate, which is separated from the control gate by an insulating layer. The gate structure is fabricated on top of a silicon substrate. The floating gate is also separated from this substrate by an insulating layer. Any electrons placed on the floating gate are trapped there due to the surrounding insulating layers. Thus, these electrons can be used to store information. When electrons are placed on the floating gate, the electrons modify, e.g., partially cancel out, the electric field being generated by a voltage supplied to the control gate, thereby modifying the threshold voltage ($V_t$) of the cell. When the cell is read by placing a specific voltage on the control gate, electrical current will either flow or not flow, depending on the threshold voltage ($V_t$) of the cell. The presence or absence of current can then be sensed and translated into a data "1" or data "0." Accordingly, a cell can be programmed by storing electrons on the floating gate and thereby changing the threshold voltage ($V_t$) of the cell.

A NOR Flash cell is programmed via a process known as Channel Hot Electron (CHE) injection. During a CHE programming operation, the appropriate voltages are applied to the source, drain, and gate of the cell to produce a current flowing from the source to the drain in the channel under the gate structure. A large voltage placed on the control gate provides a strong enough electric field to cause some of the electrons to tunnel through the lower insulating layer onto the floating gate. A NOR Flash cell is then erased by applying a large voltage differential between the control gate and the source, which causes the electrons to tunnel through the lower insulating layer.

NAND devices use tunnel injection for programming and tunnel release for erasing. The tunneling mechanism is referred to as Fowler-Nordheim tunneling, which is well-known in the art.

Both NOR and NAND-type Flash memory devices can be programmed on a bit-by-bit basis. In other words, programming methods exist that allow a single bit to be programmed, while prohibiting program disturb of surrounding cells; however, both NOR and NAND-type devices must be erased by blocks. In other words, the cells are grouped into sectors, or blocks and all of the cells in a particular sector or block are erased at the same time.

More recently, multi-level cell (MLC) approaches have been used to store multiple bits per cell in both NOR and NAND type devices. MLC techniques allow for increased density in a smaller area and are therefore beneficial as it increases the amount of data being stored in Flash applications. In an MLC cell, the threshold is varied between multiple discreet levels by storing varying amounts of charge on the floating gate. The amount of current flowing when a voltage is applied to the control gate can then be sensed to determine how much charge is stored on the floating gate. In other devices, e.g., a nitride read only memory device, multiple bits can be stored in each cell by storing charge in different areas of the charged trapping structure. Accordingly, charge can be stored near the source on one side of the gate structure, and charge can be stored near the drain on the other side of the gate structure. These charges can then be independently sensed in order to determine the programming status of each bit.

MLC devices require a very tight threshold voltage ($V_t$) distribution control. Unfortunately, conventional Flash memory techniques do not always allow this type of distribution control.

Conventionally, NOR-type devices have been more reliable than their NAND counterparts, and therefore are used for data critical application such as for storing executable software code. NAND-type devices, on the other hand, have higher densities and are therefore more attractive when the application requires the storage of large amounts of data. More recently, the reliability of NAND-type devices has improved such that it now rivals, or even surpasses that of NOR-type devices. Accordingly, NAND-type devices are becoming more popular because they provide the high storage capacity of conventional NAND devices with the reliability normally associated with NOR devices.

Even so, conventional NAND-type memory devices still suffer the drawback of being restricted to block erase operations, and the difficulty in controlling the threshold voltage ($V_t$) with sufficient precision to enable MLC operation.

SUMMARY

A NAND-type Flash memory device is capable of being programmed and erased on a bit-by-bit basis, which enables tight threshold voltage ($V_t$) distribution control. Accordingly, the NAND memory device can be configured for MLC operation.

In one aspect, a NAND memory device is constructed using Silicon On Insulator (SOI) techniques. In particular, Thin Film Transistor (TFT) techniques can be used to fabricate a NAND Flash memory device described herein. In both SOI and TFT structures, the body, or well, is isolated. This can be used to enable the bit-by-bit programming and erasing of individual cells and allows the tight control of the threshold voltage, which can enable MLC operation.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 1 is a diagram illustrating an example NAND memory array in accordance with one embodiment;

FIG. 2 is a schematic diagram illustrating the schematic equivalent of the array of FIG. 1;

DETAILED DESCRIPTION

It will be understood that any dimensions, measurements, ranges, test results, numerical data, etc., presented below are approximate in nature and unless otherwise stated not intended as precise data. The nature of the approximation involved will depend on the nature of the data, the context, and the specific embodiments or implementations being discussed.

The embodiments described below are directed to methods for operating a NAND flash memory device in a manner that allows for both program-to-high and program-to-low operation. This allows the device to be both programmed and erased on a bit-by-bit basis. The device can also be configured to program and erase simultaneously. Further, since each cell in the device can be bit-by-bit corrected, a tight threshold voltage ($V_t$) distribution control required for MLC operation can be achieved.

Figure 3:
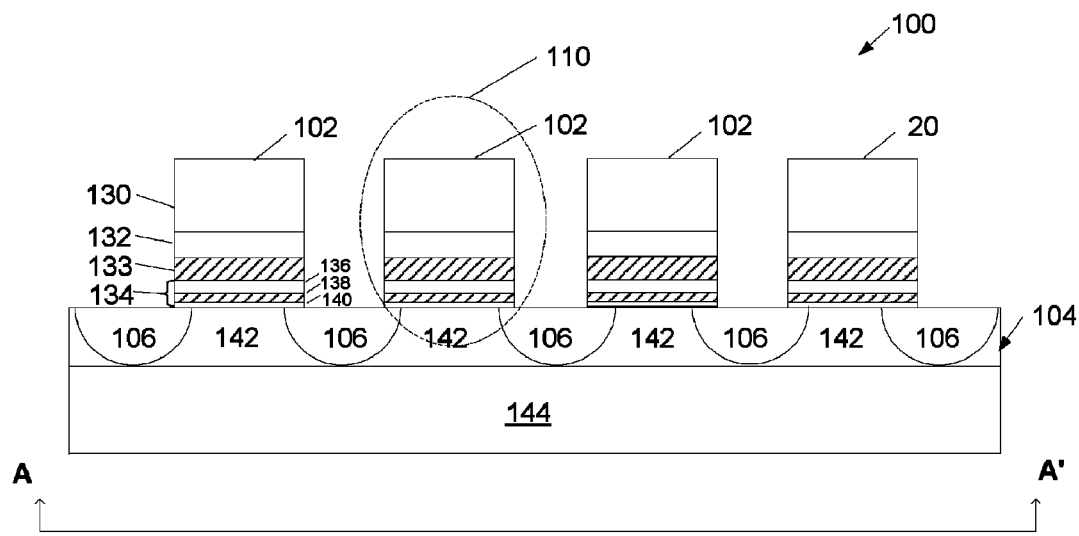
FIG. 3 is a diagram illustrating a cross sectional view of the array of FIG. 1.
Figure 4:
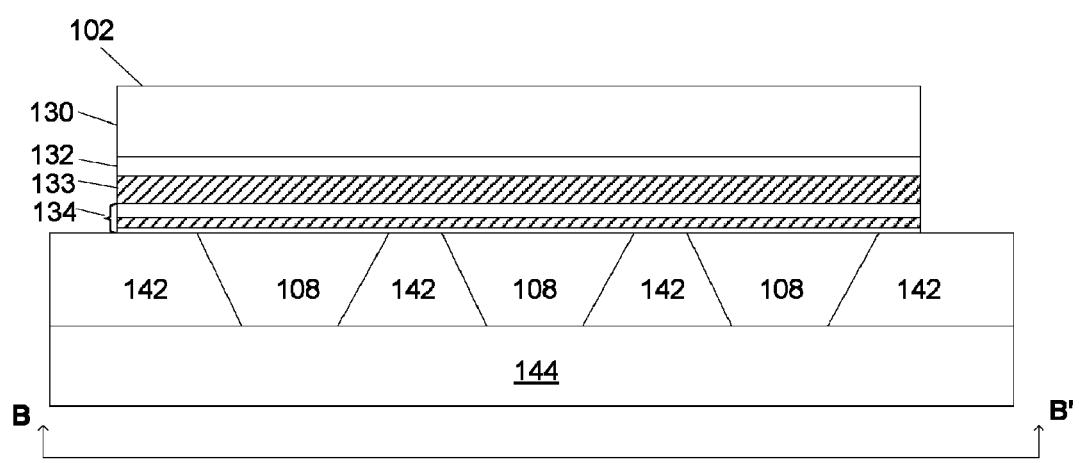
FIG. 4 is a diagram illustrating another cross sectional view of the array of FIG. 1.

FIG. 1 is a diagram illustrating a top view of the various layers comprising a NAND flash memory array 100 configured in accordance with the embodiments described herein. As will be explained in more detail below, the layers illustrated in FIG. 1 are formed over an insulating material using Silicon-on-Insulator (SOI) techniques. More particularly, in certain embodiments, Thin-Film-Transistor (TFT) fabrication technique can be used to form memory array 100. The SOI and TFT structures share the similar feature that the body, or well, for each cell 110 is isolated from the body, or well of other cells in the device. This isolation is illustrated in FIGS. 3 and 4.

As can be seen in FIG. 1, word lines 102 are formed over bit lines 104. Bit lines 104 are separated by Shallow Trench Isolation (STI) structures 108. STI structures are well-known and will not be described in detail here; however, it will be clear that STI structures 108 provide isolation between adjacent bit lines 104. Source/drain regions 106 can then be implanted into bit lines 104 in the areas not covered by word lines 102. The areas under word lines 102 can then act as the channel regions for a particular cell, such as cell 110 illustrated in the middle of array 100.

With reference to cell 110, the source/drain regions 106 on either side of word line 102 act as the source/drain regions for cell 110 and the region of bit line 104 under word line 102 acts as the channel region for cell 110. As explained in more detail below, by applying the appropriate voltages to source/drain regions 106 and word lines 102, cell 110 can be programmed and erased on a bit-by-bit basis relative to the other cells within array 100. It should be noted that cell 110 can be an N-channel or P-channel cell depending on the embodiment. But regardless of whether cell 110 is an N-channel or P-channel cell, cell 110 can be programmed and erased on a bit-by-bit basis relative to the other cells in array 100 using the methods described herein.

Unlike conventional EEPROM which typically also allow bit-by-bit program and erase operations, cells of array 100 can be made very small. For example, an EEPROM often requires two transistors, and the cell size is often relatively large, e.g., greater than 20 $F^2$. In contrast, a cell such as cell 110 in array 100 can use the single transistor NAND architecture and thus the cell size can be minimal, e.g. approximately 4 $F^2$. Moreover, as explained in more detail below, using a TFT NAND architecture can also facilitate the use of a three-dimensional, stacked architecture, which can significantly increase density.

FIG. 2 is a schematic diagram of array 100. As can be seen, word lines 102 are attached to the gates of cell transistors 110. The bit lines 104 are then attached to source/drain regions 106 via bit line transistors 114. The gates of bit line transistors 114 are controlled via bit line transistor control line 116. The other side of cell transistors 110 is controlled via source line 126 which is interfaced with cell transistors 110 via source line transistors 112. The gates of source line transistors 112 are controlled via source line transistor control line 122.

FIGS. 3 and 4 are diagrams illustrating cross-sectional views of the layers illustrated in FIG. 1 along the lines AA' and BB' respectively. As can be seen in FIG. 3, array 100 is formed on an insulating layer 144. For example, insulating layer 144 can be sapphire or a silicon dioxide ($SiO_2$) layer. Bit lines 104 can then be formed over insulating layer 144 by depositing a semiconductor material 142 over layer 144, the semiconductor material 142 can then be patterned and etched using conventional photolithography techniques in order to produce bit lines 104. Word lines 102 can then be formed over bit lines 104 by sequentially forming layers of the appropriate material over bit lines 104 and patterning and etching the layers to produce word lines 102. Once word lines 102 are formed, source/drain regions 106 can then be implanted into bit lines 104, e.g., using a self-aligned process. This will leave channel regions 142 under word lines 102 and between source and drain regions 106.

As illustrated in FIG. 1, STI structures 108 can be formed between bit lines 104. This is also illustrated in FIG. 4 which is a cross-sectional view along the line BB' from FIG. 1. Thus, channel regions 142 under word lines 102 are separated from each other by STI structures 108.

Referring to FIG. 3, word lines 102 form the gate structures for each cell 110 in array 100. As explained in more detail below, a variety of gate structures can be used in accordance with the embodiments described herein. In the example of FIG. 3, a Bandgap Engineered-Silicon-Oxide-Nitride-Oxide-Silicon (BE-SONOS) gate structure is used for cells 110. Accordingly, each gate structure comprises an ONO structure 134, nitride layer 133, oxide layer 132, and a polysilicon layer 130 sequentially formed over bit lines 104. As will be understood, ONO layer 134 can comprise an oxide layer 140, nitride layer 138, and oxide layer 136 sequentially formed over bit line 104.

A BE-SONOS gate structure is described in more detail below, as are other possible gate structures that can be used in accordance with the embodiments described herein.

Figure 5B:
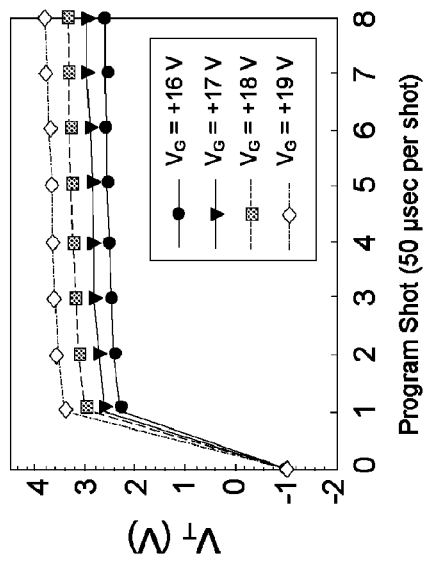
FIG. 5B is a graph illustrating example programming characteristics for the array of FIG. 1 for varying programming voltages.
Figure 5C:
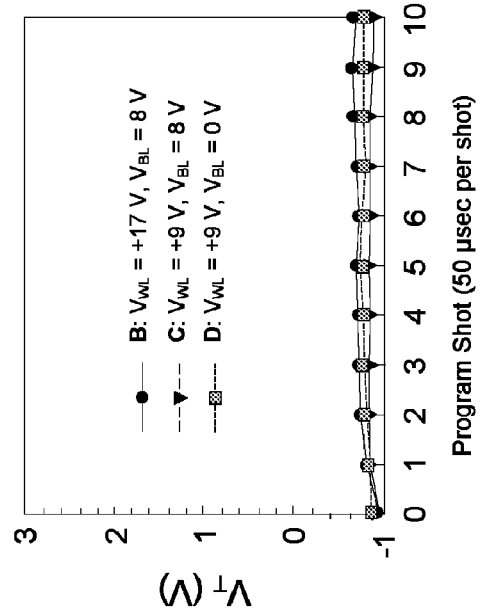
FIG. 5C is a graph illustrating example program prohibit effects for the array of FIG. 1 for varying programming voltages.
Figure 5A:
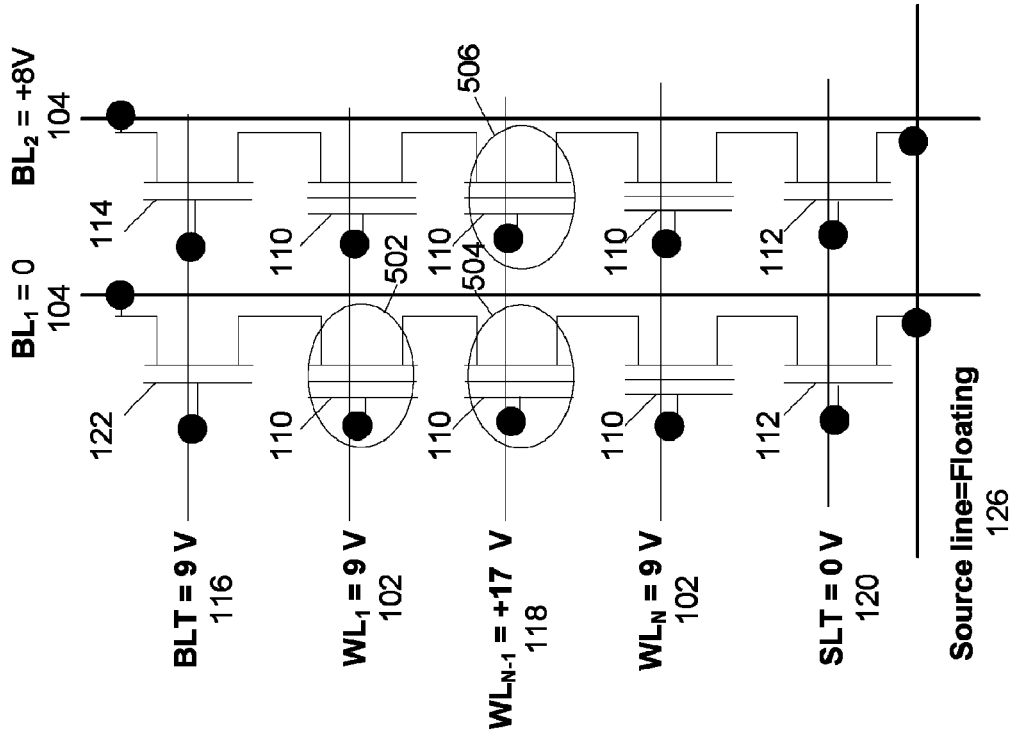
FIG. 5A is a diagram illustrating an example programming operation for the array of FIG. 1.

FIG. 5A is a diagram illustrating voltages that can be applied to array 100 during a programming operation in accordance with one embodiment. In the example of FIG. 5A, cell 504 is the target cell. Further, in the example of FIG. 5A, array 100 comprises N-channel cells 110, although as explained above, the embodiments described herein can also be used for P-channel cells.

Referring to FIG. 5A, programming of cell 504 can be achieved by applying a high voltage (e.g., 17 V) to word line 118 associated with cell 504 ($WL_{N-1}$) and a medium voltage (e.g., 9 V) to the unselected word lines 102. For example, in certain embodiments a voltage in the range of approximately 14 V to 20 V can be applied to word line 118 associated with cell 504, while a medium voltage in the range of 6 to 12 V is applied to the other word line 102. In one specific example, a high voltage of approximately 17 V can be applied to word line 118 associated with cell 504, while voltage of approximately 9 V is applied to word lines 118 associated with the unselected cell 502.

The selected bit line 122, in this case $BL_1$, is tied to a low voltage, or grounded so as to create a sufficient voltage drop across selected cell 504. For example, if a high voltage of 17 V is applied to the associated word line 118, then the voltage drop across cell 504 will be approximately 17 V. FIG. 5B is a diagram illustrating example programming characteristics for cell 504 for varying word line voltages. As can be seen, by applying a word line voltage of between 16 V and 19 V, while grounding the associated bit line 122, the threshold of cell 504 can be raised to a high threshold voltage of between approximately 2 V and 3.5 V. In the example of FIG. 5B, the programming voltages were applied for a duration of approximately 50 μsec.

During the programming operation, a high bit-line voltage (e.g., 8 V) is applied to the unselected bit line 104, in this case $BL_2$, such that the voltage drop across adjacent, unselected cell 506 is relatively small. For example, a voltage in the range from approximately 5 V to 11 V can be applied to the unselected bit line 104. In one specific implementation, a voltage of approximately 8 V is applied to the unselected bit line 104.

Applying the high bit-line voltage to the unselected bit line, and thereby creating a relatively small drop across adjacent cell 506, inhibits program disturb of adjacent cell 506. FIG. 5C is a diagram illustrating the program inhibit effects for various voltages applied to word lines 102 and bit lines 104 and 122. In the example of FIG. 5C, a high word-line voltage of 17V is applied to word line 118 associated with cell 504, while medium word-line voltages of approximately 9V are applied to the unselected word lines 102. A low bit-line voltage of approximately 0V is applied to selected bit line 122 associated with cell 504, while a high bit-line voltage of approximately 8V is applied to the unselected bit line 104. As can be seen, the threshold voltage for unselected cells 502 and 506 remains low at around −1 volts, and change by less than 0.5 Volts.

Accordingly, cells 110 of array 100 can be programmed on a bit-by-bit basis, i.e., using the methods described above.

Array 100 can also be erased in either a block or sector erase operation or, as explained below, on a cell-by-cell basis. With reference to FIG. 2, a sector erase can be implemented by applying a low voltage (e.g., −18 V) to all of the word lines 102 while applying a grounding voltage (e.g., 0V) to all of the bit lines 104. This allows the threshold voltage for each cell 110 to be lowered.

Additionally, however, cells 110 can be erased on a cell-by-cell basis. FIG. 6A illustrates an example embodiment for a cell-by-cell erase operation. In the example of FIG. 6A, cell 604 is the target cell being erased. In order to erase target cell 604 without affecting, e.g., adjacent cells 602 and 606, a medium low word-line voltage (e.g., −10 V) is applied to word line 118 associated with cell 604 ($WL_{N-1}$), while a medium high word-line voltage (e.g., 10 V) is applied to the unselected word lines 102. For example, in one embodiment, a low word-line voltage in the range of approximately −7 V to −13 V can be applied to word line 118 associated with cell 604, while a medium word-line voltage in the range of approximately 7 V to 13 V can be applied to the unselected word lines 102. In one specific example, a low word-line voltage of approximately −10 V is applied to the selected word line 118, while a medium word-line voltage of approximately 10 V is applied to the unselected word lines 102.

A high bit-line voltage (e.g., 8 V) can then be applied to the selected bit line 122 ($BL_1$), while the unselected bit lines 104 are tied to approximately 0 volts. A high bit-line voltage should be applied to bit line transistor control line 116 in order to turn on pass transistors 114 and allow the voltage applied to the selected bit lines 104 and 122 to pass through to cells 110. Pass transistors 112, on the other hand, can be turned off by tying source line transistor control line 120 to approximately 0 volts. Source line 126 can be allowed to float through the operation.

The total gate voltage applied to cell 604 will be equal to the voltage applied to word line 118 minus the voltage applied to the selected bit line 122. Accordingly, if −10V is applied to the selected word line 118 and 8V is applied to the selected bit line 122, then the total gate voltage will be −18 V, which should be sufficient to erase cell 604. At the same time, the total gate voltage applied to the unselected cells, e.g., cells 602 and 606 will only be −10 V, which provides a very good erase disturb margin.

Figure 6B:
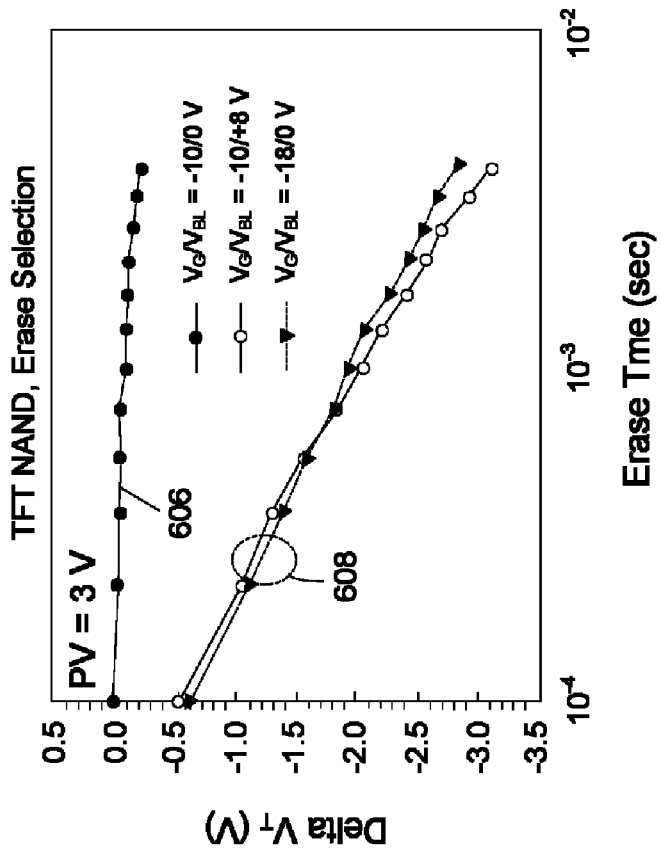
FIG. 6B is a diagram illustrating the timing and results for the operation illustrated in FIG. 6A.
Figure 6A:
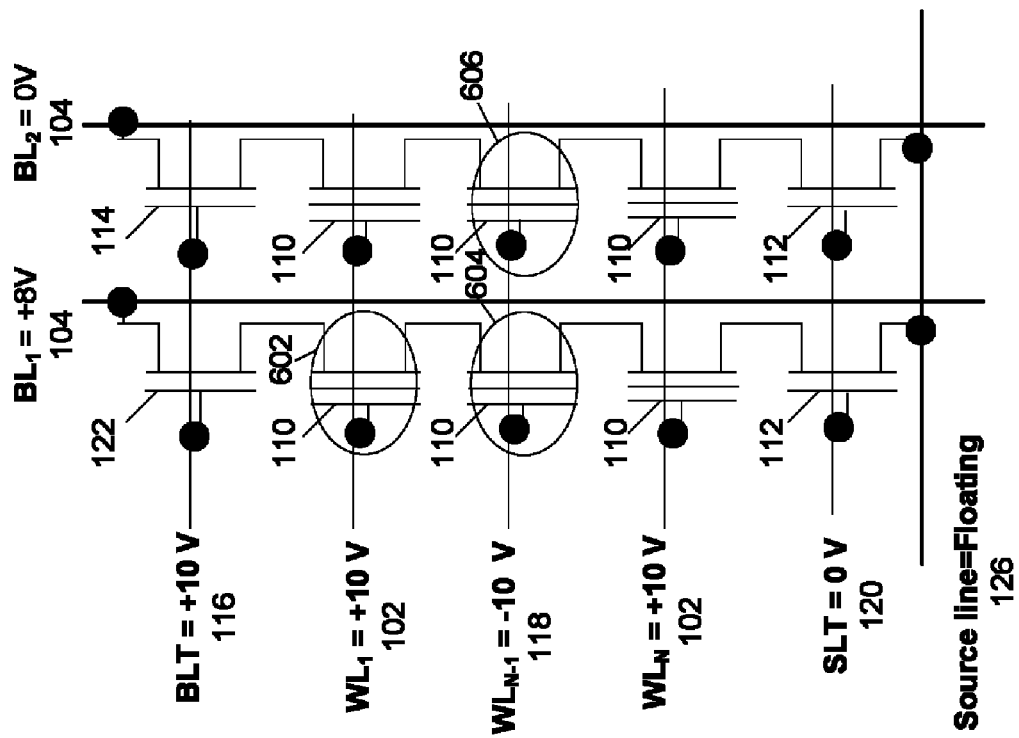
FIG. 6A is a diagram illustrating an example bit-by-bit erase operation for the array of FIG. 1 in accordance with one embodiment.

FIG. 6B is a diagram illustrating the timing and results for the operation illustrated in FIG. 6A. Curves 608 illustrate that a cell can be effectively erased by either applying a large negative word-line voltage, e.g., −18V, to the selected word line, while tying the selected bit line to approximately 0 volts, or by applying a medium negative word-line voltage, e.g., −10V, to the selected word line 118, and a high bit-line voltage, e.g., +8V to the selected bit line 122. In other words, whether erasing an entire sector, or an individual cell, the erase operation can be performed with approximately the same efficiency and results. As can be seen in curve 608 of FIG. 6B, the threshold voltage of the selected cell decreases by at least 1 Volt.

Curve 606 illustrates that the erase disturb effects for unselected cells, e.g., cells 602 and 606, can be kept to a minimum using the operation described in FIG. 6A. As can be seen in curve 606 of FIG. 6B, the threshold voltage of unselected cell 606 changes by less than 0.5 Volts. As described, a negative voltage is applied to the gates so as to prevent the formation of an inversion channel in each cell. As a result, a positive voltage applied to a selected bit line cannot raise the well as needed to achieve erase of an individual unselected cell.

When using an SOI or TFT architecture, the body of each cell is effectively floating relative to each bit line. This is because the STI structures isolate the body for each cell. Under such conditions, the body potential for an individual cell can be controlled using a bit line voltage as described in relation to FIG. 6A. The bit line voltage will raise the body potential to a voltage very close to that applied to the bit line. This produces the net gate voltage needed to erase a particular cell. Again, as described in relation to FIG. 6B, the erase result can be similar, or even the same as that achieved for a sector erase.

It should be noted that the operations described above can also be implemented for a P-channel NAND structure by creating inverse programming and erase voltage conditions.

The ability to program and erase on an individual cell basis allows for a very tight threshold voltage ($V_t$) distribution. The threshold voltage ($V_t$) distribution can enable MLC applications. This can be achieved by adjusting the amount of charge stored in an individual cell 1110.

Further, a review of the voltages applied in FIGS. 5A and 6A make clear that a certain cell can be programmed, while another cell is being erased. For example, a cell in the same row as cell 506 can be being erased, while cell 504 is being programmed.

Figure 7:
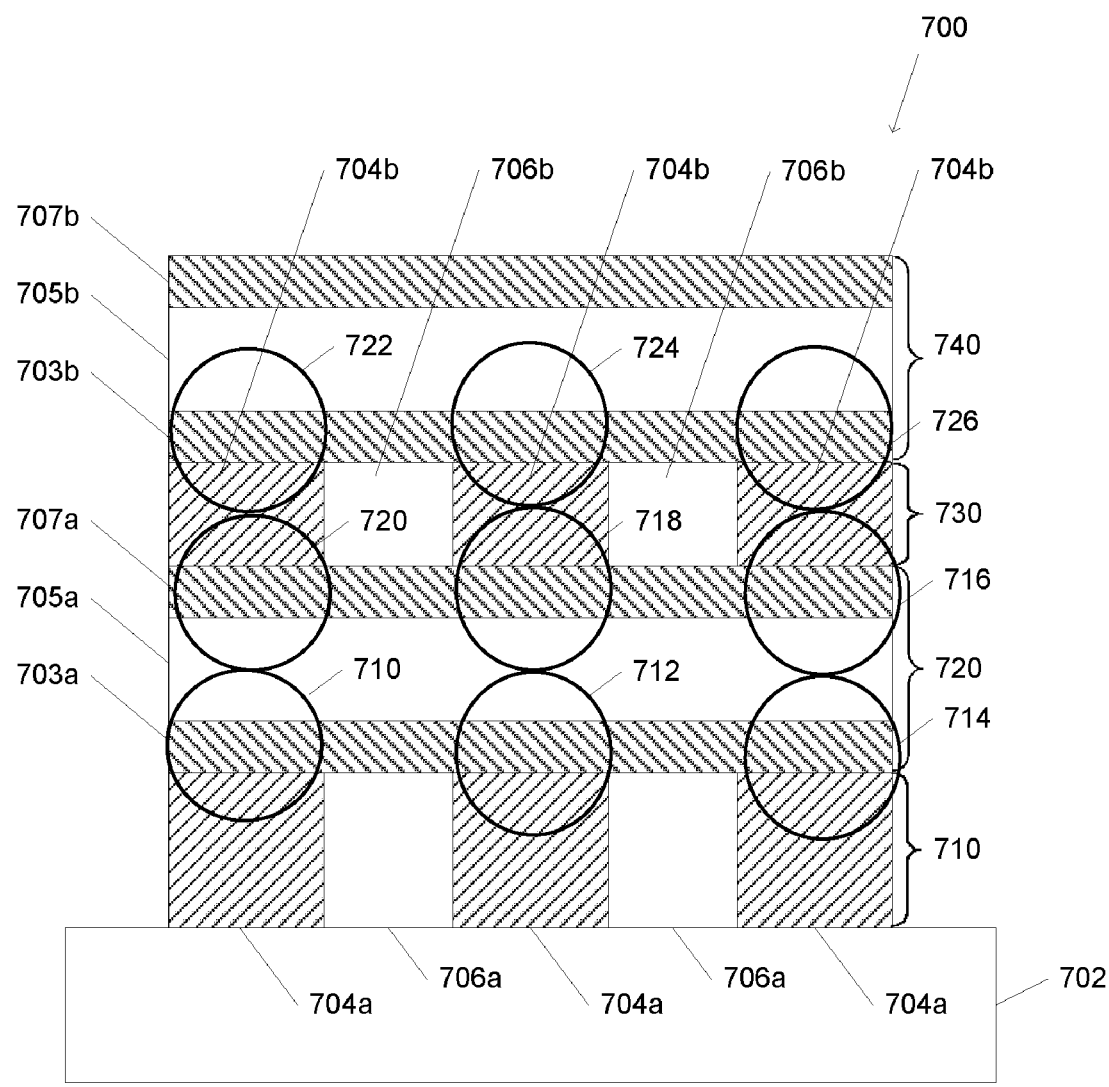
FIG. 7 is a diagram illustrating a cross sectional view of a 3-dimensional NAND memory array in accordance with one embodiment.

Further, as noted above, the density of a device configured to implement the operations described herein can be increased by using a 3-dimensional, stacked architecture. FIG. 7 is a diagram illustrating an exemplary TFT, stacked NAND memory 700 in accordance with one embodiment. In the example of FIG. 7, NAND memory 700 is fabricated on top of an insulating layer 702. Accordingly, device 700 is fabricated using SOI processing techniques. For example, device 700 can be fabricated using TFT processing techniques. A TFT is a special kind of field effect transistor made by depositing thin films for the metallic contacts, semiconductor active layer, and dielectric layer on an insulating layer. The channel region of a TFT is a thin film that is deposited onto a substrate that is often glass.

Successive bitline layers and wordline layers can then be fabricated on insulating layer 702. For example, in FIG. 7 a first bitline layer 710 is fabricated on insulating layer 702. A first wordline layer 720 is then fabricated on top of first bit line layer 710. A second bitline layer 730 is then fabricated on top of first wordline layer 720. Finally, a second wordline layer 740 is fabricated on top of second bitline layer 730.

Further bitline and wordline layers can be successively fabricated on top of the layers illustrated in FIG. 7. Thus, two bitline layers and two wordline layers are shown for convenience only and the methods described herein should not be seen as limited to a certain number of bitline layers and/or wordline layers. Each bitline layer 710 and 730 comprises a plurality of bitlines 704 separated by insulating regions 706. Each wordline layer 720 and 740 comprises a wordline conductor 705 sandwiched between trapping layers 703 and 707.

By using the stacked configuration illustrated in FIG. 7, greater memory densities can be achieved. The density can be increased even further through MLC operation made possible by the operation methods described above.

An example process for fabricating device 700 is described in detail in Co-pending U.S. patent application Ser. No. 11/425,959 entitled "A Stacked Non-Volatile Memory Device and Methods for Fabricating the Same," filed Jun. 22, 2006, which is incorporated herein by reference in the entirety as if set forth in full.

Figure 8:
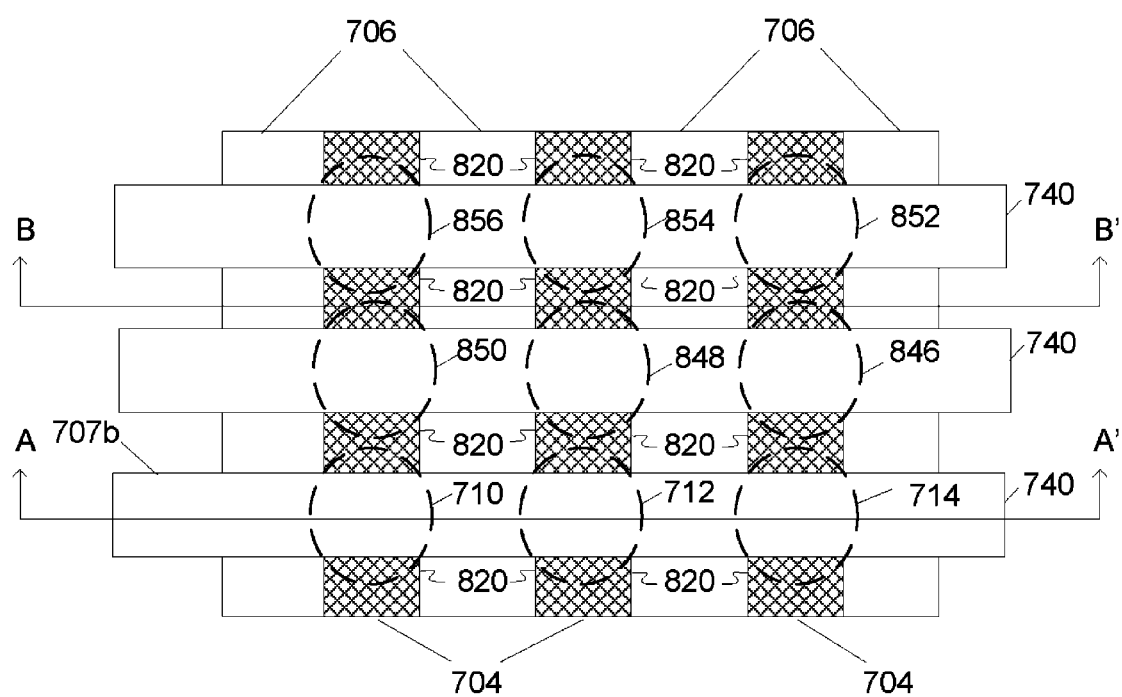
FIG. 8 is a diagram illustrating a top view of the array of FIG. 7.

FIG. 8 is a top view of device 700. FIG. 7 is a cross sectional view of the layer illustrated in FIG. 8 along the line AA". As can be seen, the top layer of device 700 can comprise a plurality of word lines 740 formed over a plurality of bit lines 704. Bit lines 704 can be separated by insulating structures 706. Source/Drain regions 820 can be implanted in bit lines 704 in the areas not covered by word lines 740. The areas of bit lines 704 under word lines 740 can then act as the channel regions for the associated cells.

Referring to FIG. 7, a plurality of vertically stacked memory cells 710-726 can then be formed within device 700. The trapping structures 703 above or below the channel regions in bit lines 704 along with the associated gate conductor 705 form the gate structures for each cell. Cells 722-724 are illustrated in FIG. 8 as are additional cells 846-856. It will be understood therefore that FIG. 8 illustrates three rows of memory cells, where each row comprises three stacked layers of cells. It will also be understood, however, that the number of rows and layers of cells illustrated in FIGS. 7 and 8 are by way of example only and that any number of rows and/or layers can be implemented depending on the requirements of a particular implementation.

As discussed above, a variety of gate structures can be used in accordance with the embodiments described herein. For example, in certain embodiments a simple floating gate structure can be used. In other embodiments, however, a more complex trapping structure can be used. FIGS. 9A-9H are diagrams illustrating example embodiments of various trapping structures that can be used, e.g., in device 700.

Figure 9A:
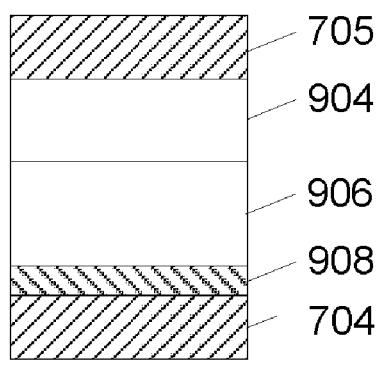
FIGS. 9A-9G are diagrams illustrating a cross sectional view of a plurality of example gate structures that can be used in the arrays of FIGS. 1 and 7.

The first exemplary embodiment illustrated in FIG. 9A comprises a Silicon-Oxide-Nitride-Oxide-Silicon (SONOS) structure. This structure comprises an oxide layer 908, nitride layer 906, and oxide layer 904 sequentially formed over polysilicon layer 704. Oxide region 908 acts as a tunnel dielectric layer and nitride layer 906 acts as a trapping layer for trapping charge. When the SONOS structure of FIG. 9A is used, charge is stored in trapping structure 906 of a particular cell by injection of holes into trapping layer 906. A cell can be erased through the direct tunneling of holes into trapping structure 906, where they compensate for any electrons previously stored in trapping structure 906. The tunneling of holes in the trapping structure 906 is achieved via Fowler-Nordheim tunneling. Oxide layer 908 can be a thin oxide layer, e.g., less than 3 nanometers thick. In the example of FIG. 9A, a polysilicon word line conductor 705 is then formed over oxide layer 904. As explained with respect to FIG. 11, certain embodiments can use a metal word line conductor.

NAND devices constructed using the SONOS trapping structure illustrated in FIG. 9A retain less charge due to leakage current that results from the direct tunneling of holes into trapping layer 906 during charge retention.

Figure 9B:
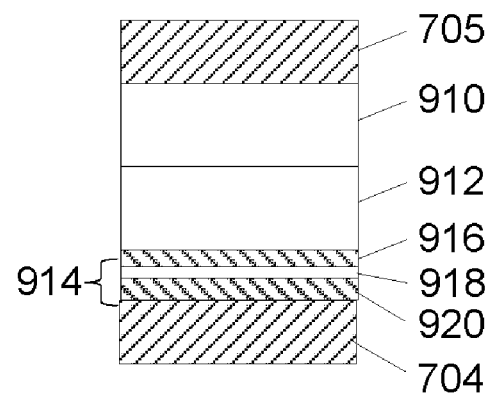

FIG. 9B is a diagram illustrating a band-gap engineered (BE)-SONOS structure. The BE-SONOS structure of FIG. 9B is fabricated by sequentially forming an ONO structure 914 followed by a nitride layer 912, and a dielectric layer 910 over polysilicon layer 704. ONO structure 914 is thus formed by sequentially forming an oxide layer 920, nitride layer 918, and an oxide layer 916 over polysilicon layer 704. As with the SONOS structure of FIG. 9A, the BE-SONOS structure of FIG. 9B uses Fowler-Nordheim hole tunneling to erase the memory cells; however, the BE-SONOS structure of FIG. 9B does not exhibit the poor charge retention that results from direct tunneling leakage, or device degradation that results from hot hole erase damage.

Figure 10A:
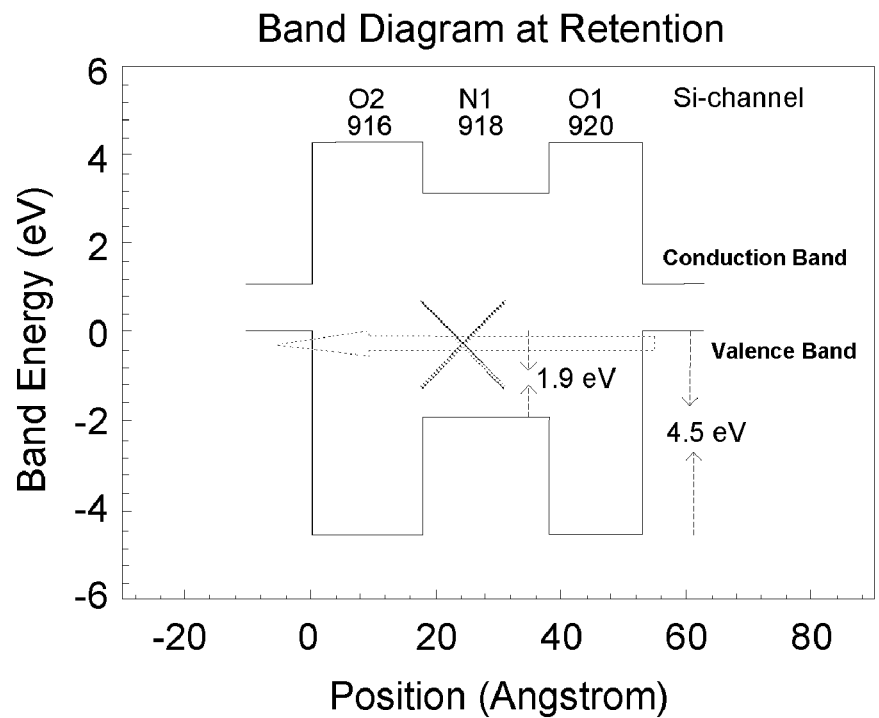
FIGS. 10A-10b are band diagrams for the gate structure of FIG. 9B under low and high electric fields respectively.
Figure 10B:
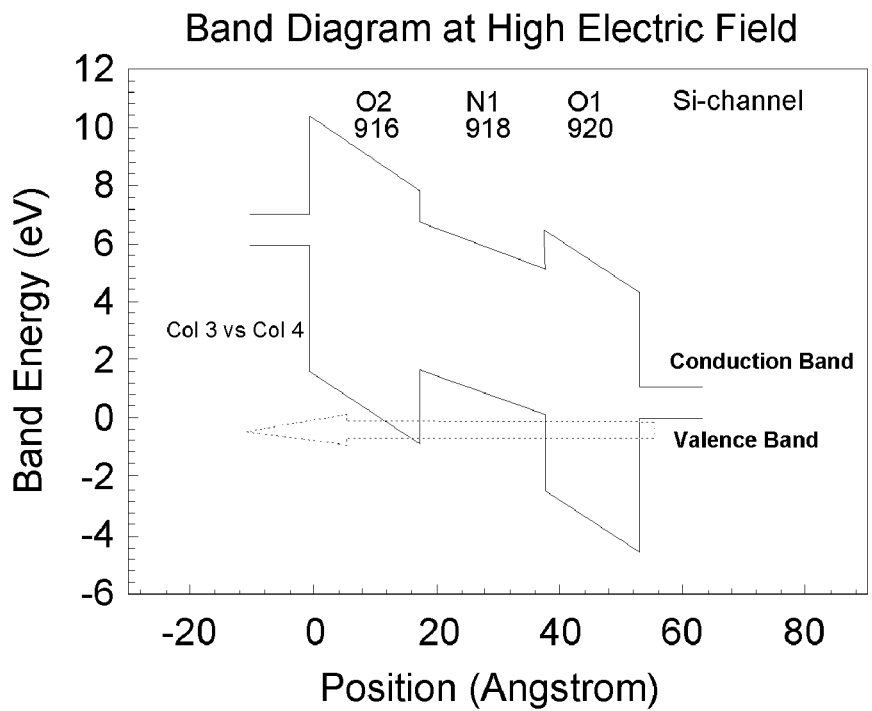

FIGS. 10A and 10B are band diagrams illustrating the energy bands for ONO structure 914, of the BE-SONOS structure illustrated in FIG. 9B. FIG. 10A is a band diagram during data retention, and FIG. 10B is a band diagram during erase. As can be seen in FIG. 10A, during retention holes do not have sufficient energy to overcome the potential barriers of the layers comprising ONO structure 914. Data retention occurs when a low electric field exists across trapping structure 914. Because tunneling of holes is blocked by structure 914, there is little tunneling leakage during application of a low field. As illustrated in FIG. 10B, however, when a high field exists across trapping structure 914, the bands shift allowing holes to tunnel across structure 914. This is because the barriers presented by layers 916 and 918 are almost eliminated from the perspective of the holes, due to the band shift when a high field is present.

BE-SONOS structures are describe in more detail in the article by Hang-Ting Lue et al., entitled "BE-SONOS: A Bandgap Engineered SONOS With Excellent Performance and Reliability," IEEE, 2005, which is incorporated herein by reference in its entirety as if set forth in full.

Figure 9C:
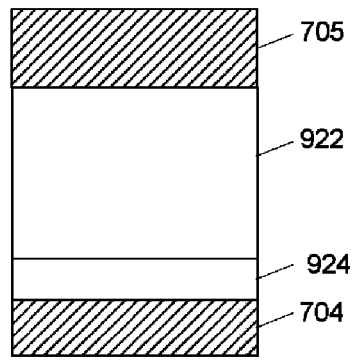

FIGS. 9C-9H illustrate other exemplary structures that can be used for the trapping layers included in device 700. For example, FIG. 9C is a diagram illustrating a SONS structure that can be used for the trapping layers included in device 700. The structure illustrated in FIG. 9C comprises a thin oxide layer 924 formed over polysilicon layer 704. A nitride layer 922 is then formed over the thin oxide layer 924. Gate conducting layer 705 can then be formed over nitride layer 922. Thin oxide layer 924 acts as the tunnel dielectric and charge can be stored in nitride layer 922.

Figure 9D:
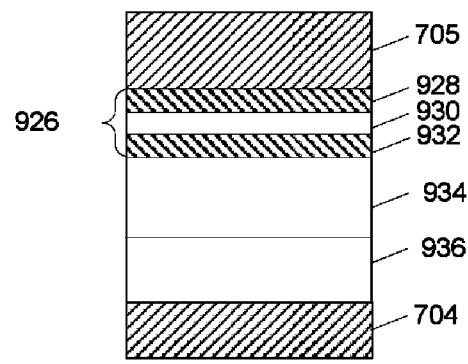

FIG. 9D is an example of a top BE-SONOS structure that can be used for trapping layers included in device 700. Accordingly, the structure illustrated in FIG. 9D comprises an oxide layer 936 formed over polysilicon layer 704. A nitride layer 934 is then formed over oxide layer 936, and ONO structure 926, comprising an oxide layer 932, nitride layer 930 and oxide layer 928, is then formed over nitride layer 934. In the example of FIG. 9D, ONO layer 926 acts as the tunnel dielectric layer and charge can be trapped in nitride layer 930.

Figure 9E:
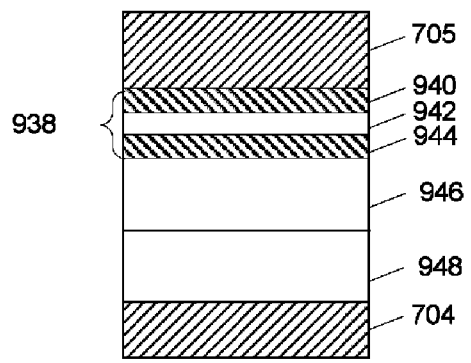

FIG. 9E is a diagram illustrating a bottom SONOSOS structure that can be used for the trapping layers included in device 700. The structure illustrated in FIG. 9E comprises an oxide layer 948 formed over polysilicon layer 704, and a nitride layer 946 formed over oxide layer 948. A thin oxide layer 944 is then formed over nitride layer 946 followed by a thin polysilicon layer 942. Another thin oxide layer 940 is then formed then over polysilicon layer 942. Accordingly, layers 940, 942, and 944 form an OSO structure 938 near gate conductor 705. In the example of FIG. 9E, oxide layer 948 can act as the tunnel dielectric and charge can be stored in nitride layer 946.

Figure 9F:
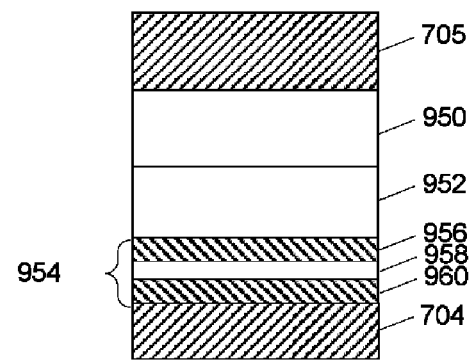

FIG. 9F is a diagram illustrating a bottom SOSONOS structure. Here, a thin OSO structure 954 is formed over polysilicon layer 704. OSO structure 954 comprises thin oxide layer 960, a thin polysilicon layer 958, and a thin oxide layer 956. A nitride layer 952 can then be formed over OSO structure 954, and an oxide layer 950 can be formed over nitride layer 954. In the example of FIG. 9F, OSO structure 954 can act as the tunnel dielectric and charge can be stored in nitride layer 952.

Figure 9G:
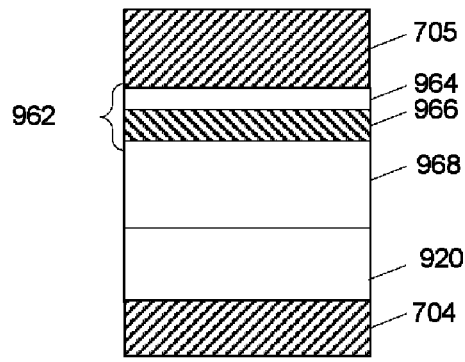

FIG. 9G is a diagram illustrating an exemplary SONONS structure that can be used for the trapping structures included in device 700. Here, an oxide layer 970 is formed over polysilicon layer 704 and a nitride layer 968 is formed over oxide layer 970. An ON structure 962 is then formed over nitride layer 968. ON structure 962 comprises a thin oxide layer 966 formed over nitride layer 968, and a thin nitride layer 964 formed over thin oxide layer 966. In the example of FIG. 9G, oxide layer 970 can act as the tunnel dielectric and charge can be trapped in nitride layer 968.

In other embodiments, the trapping structure can comprise a SiN or a SiON, or a Hi-K material such as $HfO_2$, $Al_2O_3$, AlN, etc. In general, any trapping structure or material can be used as long as it meets the requirements of a particular implementation.

Figure 11:
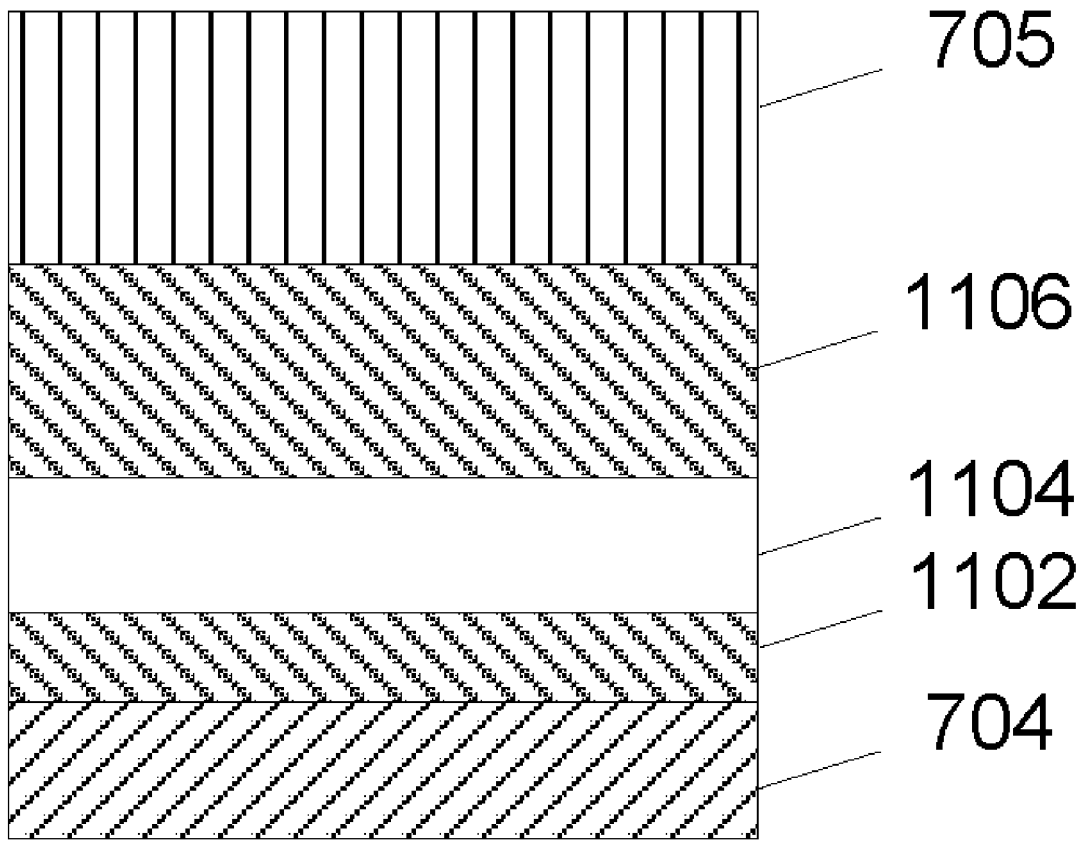
FIG. 11 is a diagram illustrating a cross sectional view of still another example gate structure that can be used in the arrays of FIGS. 1 and 7.

In certain embodiments, a metal word line conductor 705 can be used in conjunction with a MONOS trapping structure. An example MONOS trapping structure that can be used in accordance with the embodiments described herein is illustrated in FIG. 11. Here, a dielectric layer, such as an oxide layer 1102 is formed over polysilicon region 704 and acts as the tunnel dielectric. A Nitride layer 1104 is then formed over layer 1102 and is configured to trap charge. Another dielectric layer 1106 is then formed over nitride layer 1104. Metal word line conductor 705 is then formed over dielectric 1106.

For example, as explained in the article by Yoocheol Shin et al. entitled, "A Novel-type MONOS Memory Suing 63 nm Process Technology For Multi-Gigabit Flash EEPROMS," IEEE, 2005, which is incorporated herein by reference as if set forth in full, metal conductor 705 can comprise TaN. Further, dielectric layer 1106 can comprise $Al_2O_3$.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for operating an array of charge storage memory cells arranged in a NAND configuration including a plurality of NAND cells on semiconductor lines and a plurality of word lines coupled in parallel to the NAND cells, the plurality of semiconductor lines on an insulating layer and isolated from adjacent semiconductor lines of the NAND cells by isolation structures on the insulating layer, memory cells in the array including charge trapping structures overlying channel regions separated by source and drain regions in a corresponding semiconductor line, the method comprising:
   changing a data value stored in a target memory cell in a first NAND cell in the array, said changing comprising:
      applying a first bit line voltage to the semiconductor line of the first NAND cell;
      applying a first word line voltage to a corresponding word line of the target memory cell, the first word line voltage and the first bit line voltage differing by an amount sufficient to change the data value stored in the target memory cell; and
      applying a second word line voltage to corresponding word lines of the remaining memory cells in the first NAND cell, thereby coupling the first bit line voltage to the channel region of the target memory cell, the first bit line voltage and the second word line voltage differing by an amount sufficient to maintain respective data values stored in the remaining memory cells of the first NAND cell.

2. The method of claim 1, wherein the changing the data value stored in the target memory cell comprises increasing a threshold voltage of the target memory cell.

3. The method of claim 2, wherein:
   the difference between the first word line voltage and the first bit line voltage is in the range of 14 to 20 Volts; and
   the difference between the second word voltage and the first bit line voltage is in the range of 6 to 12 Volts.

4. The method of claim 3, wherein:
   the first word line voltage is in the range of 14 to 20 Volts;
   the second word line voltage is in the range of 6 to 12 Volts;
   the first bit line voltage is 0 Volts.

5. The method of claim 1, wherein the changing the data value stored in the target memory cell comprises decreasing a threshold voltage of the target memory cell.

6. The method of claim 5, wherein:
the difference between the first word line voltage and the first bit line voltage is in the range of −15 to −21 Volts; and
the difference between the second word line voltage and the first bit line voltage is in the range of −1 to 5 Volts.

7. The method of claim 6, wherein:
the first word line voltage is in the range of −7 to −13 Volts;
the second word line voltage is in the range of 7 to 13 Volts;
the first bit line voltage is 8 Volts.

8. The method of claim 1, wherein the charge trapping structure of memory cells in the array comprise:
a first oxide layer on a corresponding semiconductor line;
a nitride charge trapping layer overlying the first oxide layer; and
a second oxide layer overlying the nitride charge trapping layer, wherein the corresponding word line is overlying the second oxide layer.

9. The method of claim 1, wherein the charge trapping structure of memory cells in the array comprise:
a first oxide layer on a corresponding semiconductor line;
a nitride charge trapping layer on the first oxide layer; and
a second oxide layer on the nitride charge trapping layer, wherein the corresponding word line is on the second oxide layer.

10. The method of claim 1, wherein the charge trapping structure of memory cells in the array comprise:
a first oxide layer on a corresponding semiconductor line;
a first nitride layer on the first oxide layer;
a second oxide layer on the first oxide layer;
a second nitride layer on the second oxide layer; and
a third oxide layer on the second nitride layer, wherein the corresponding word line is on the third oxide layer.

11. The method of claim 10, wherein the first nitride layer is a charge trapping layer.

12. The method of claim 10, wherein the second nitride layer is a charge trapping layer.

13. The method of claim 1, wherein the array of charge storage memory cells are arranged in a 3-dimensional NAND configuration and further include:
a second plurality of NAND cell semiconductor lines overlying the plurality of word lines; and
a second plurality of word lines overlying the second plurality of NAND cell semiconductor lines.

14. The method of claim 1, wherein the array of charge storage memory cells are manufactured using a thin-film-transistor fabrication technique.

15. The method of claim 1, further comprising applying a second bit line voltage to the semiconductor line of a second NAND cell semiconductor line, the first word line voltage and the second bit line voltage differing by an amount sufficient to maintain a data value stored in a memory cell in the second NAND cell coupled to the corresponding word line of the target memory cell.

16. The method of claim 15, further comprising changing a data value stored in a second target memory cell in the second NAND cell while changing the data value stored in the target cell in the first NAND cell, the second target cell coupled to the same word line as one of the remaining memory cells in the first NAND cell, and the second bit line voltage and the second word line voltage differing by an amount sufficient to change the data value stored in the second target cell.

17. The method of claim 16, wherein:
the changing the data value stored in the target memory cell comprises increasing the threshold voltage of the target memory cell; and
the changing the data value stored in the second target memory cell comprises decreasing the threshold voltage of the second target memory cell.

18. The method of claim 16, wherein:
the changing the data value stored in the target memory cell comprises decreasing the threshold voltage of the target memory cell; and
the changing the data value stored in the second target memory cell comprises increasing the threshold voltage of the second target memory cell.

19. A method for operating an array of charge storage memory cells arranged in a NAND configuration including a plurality of NAND cells on semiconductor lines and a plurality of word lines coupled in parallel to the NAND cells, the plurality of semiconductor lines on an insulating layer and isolated from adjacent semiconductor lines of the NAND cells, memory cells in the array including charge trapping structures overlying channel regions separated by source and drain regions in a corresponding semiconductor line, the method comprising:
changing a data value stored in a target memory cell in a first NAND cell in the array, said changing comprising:
applying a first bit line voltage to the semiconductor line of the first NAND cell;
applying a first word line voltage to a corresponding word line of the target memory cell, the first word line voltage and the first bit line voltage differing by an amount sufficient to change the data value stored in the target memory cell; and
applying a second word line voltage to corresponding word lines of the remaining memory cells in the first NAND cell, thereby coupling the first bit line voltage to the channel region of the target memory cell, the first bit line voltage and the second word line voltage differing by an amount sufficient to maintain respective data values stored in the remaining memory cells of the first NAND cell; and
applying a second bit line voltage to the semiconductor line of a second NAND cell semiconductor line, the first word line voltage and the second bit line voltage differing by an amount sufficient to maintain a data value stored in a memory cell in the second NAND cell coupled to the corresponding word line of the target memory cell, wherein:
changing the data value stored in the target memory cell comprises increasing the threshold voltage of the target memory cell by at least 3 Volts; and
maintaining the data value stored in the memory cell in the second NAND cell comprises changing a threshold voltage of the memory cell by less than 0.5 Volts.

20. A method for operating an array of charge storage memory cells arranged in a NAND configuration including a plurality of NAND cells on semiconductor lines and a plurality of word lines coupled in parallel to the NAND cells, the plurality of semiconductor lines on an insulating layer and isolated from adjacent semiconductor lines of the NAND cells, memory cells in the array including charge trapping structures overlying channel regions separated by source and drain regions in a corresponding semiconductor line, the method comprising:
changing a data value stored in a target memory cell in a first NAND cell in the array, said changing comprising:
applying a first bit line voltage to the semiconductor line of the first NAND cell;

applying a first word line voltage to a corresponding word line of the target memory cell, the first word line voltage and the first bit line voltage differing by an amount sufficient to change the data value stored in the target memory cell; and applying a second word line voltage to corresponding word lines of the remaining memory cells in the first NAND cell, thereby coupling the first bit line voltage to the channel region of the target memory cell, the first bit line voltage and the second word line voltage differing by an amount sufficient to maintain respective data values stored in the remaining memory cells of the first NAND cell; and applying a second bit line voltage to the semiconductor line of a second NAND cell semiconductor line, the first word line voltage and the second bit line voltage differing by an amount sufficient to maintain a data value stored in a memory cell in the second NAND cell coupled to the corresponding word line of the target memory cell, wherein:

changing the data value stored in the target memory cell comprises decreasing the threshold voltage of the target memory cell by at least 1 Volt; and maintaining the data value stored in the memory cell in the second NAND cell comprises changing a threshold voltage of the memory cell by less than 0.5 Volts.

21. A method for operating an array of charge storage memory cells arranged in a NAND configuration including a plurality of NAND cells on semiconductor lines and a plurality of word lines coupled in parallel to the NAND cells, the plurality of semiconductor lines on an insulating layer and isolated from adjacent semiconductor lines of the NAND cells, memory cells in the array including charge trapping structures overlying channel regions separated by source and drain regions in a corresponding semiconductor line, the method comprising:

changing a data value stored in a target memory cell in a first NAND cell in the array by decreasing a threshold voltage of the target memory cell, said changing comprising:

applying a first bit line voltage to the semiconductor line of the first NAND cell;

applying a first word line voltage to a corresponding word line of the target memory cell, the first word line voltage and the first bit line voltage differing by an amount sufficient to change the data value stored in the target memory cell; and applying a second word line voltage to corresponding word lines of the remaining memory cells in the first NAND cell, thereby coupling the first bit line voltage to the channel region of the target memory cell, the first bit line voltage and the second word line voltage differing by an amount sufficient to maintain respective data values stored in the remaining memory cells of the first NAND cell.

* * * * *